United States Patent [19]

Hung et al.

[11] 4,199,385
[45] Apr. 22, 1980

[54] METHOD OF MAKING AN OPTICALLY ISOLATED MONOLITHIC LIGHT EMITTING DIODE ARRAY UTILIZING EPITAXIAL DEPOSITION OF GRADED LAYERS AND SELECTIVE DIFFUSION

[75] Inventors: Roland Y. Hung; Kwang K. Shih, both of Yorktown Heights, N.Y.

[73] Assignee: International Business Machines Corporation, Armonk, N.Y.

[21] Appl. No.: 17,643

[22] Filed: Mar. 5, 1979

Related U.S. Application Data

[62] Division of Ser. No. 835,098, Sep. 21, 1977.

[51] Int. Cl.² ............... H01L 21/76; H01L 33/00; H01L 21/20
[52] U.S. Cl. .................. 148/175; 29/569 L; 29/580; 148/171; 250/211 J; 313/500; 357/17; 357/55; 357/90
[58] Field of Search ............... 148/171–173, 148/175; 29/569 L, 577, 578, 580; 250/211 J; 357/16, 17, 18, 55, 90; 307/34; 313/500

[56] References Cited

U.S. PATENT DOCUMENTS

| | | | |
|---|---|---|---|
| 3,763,405 | 10/1973 | Mitsubata | 357/17 X |
| 3,846,193 | 11/1974 | Jacobus et al. | 357/17 X |
| 3,873,382 | 3/1975 | Groves et al. | 148/17 S |
| 3,890,170 | 6/1975 | Russ | 148/17 S |
| 3,930,912 | 1/1976 | Wisbey | 29/580 X |
| 3,936,855 | 2/1976 | Goell et al. | 357/17 |
| 3,946,417 | 3/1976 | Jacobus et al. | 357/17 |
| 3,947,840 | 3/1976 | Craford et al. | 313/500 X |
| 3,981,023 | 9/1976 | King et al. | 148/17 S X |
| 4,053,914 | 10/1977 | Goodwin | 357/17 |
| 4,142,196 | 2/1979 | Diguet et al. | 357/17 |

OTHER PUBLICATIONS

Murray et al., "Lighting Up in a Group", Electronics, Mar. 4, 1968, pp. 104–110.
Craford et al., "LED Technology", Solid State Technology, Jan. 1974, pp. 39–46 and 58.

*Primary Examiner*—R. Dean
*Assistant Examiner*—W. G. Saba
*Attorney, Agent, or Firm*—Alvin J. Riddles

[57] ABSTRACT

Monolithic light emitting diode arrays may be fabricated by using a two layer binary semiconductor substrate wafer providing a gradient of ingredient concentration in one portion of the wafer and forming p-n junctions to a desired depth in the graded concentrated wafer and selectively removing portions of the opposite side of the wafer adjacent to said p-n junctions in order to permit light of varying colors to escape and to provide optical isolation. Metallurgical pads are provided to each of the p-n junctions for solder reflow type connections.

4 Claims, 3 Drawing Figures

METHOD OF MAKING AN OPTICALLY ISOLATED MONOLITHIC LIGHT EMITTING DIODE ARRAY UTILIZING EPITAXIAL DEPOSITION OF GRADED LAYERS AND SELECTIVE DIFFUSION

This is a division of application Ser. No. 835,098 filed 09/21/77.

BACKGROUND OF THE INVENTION

Light emitting diodes have emerged as very useful devices in recent years. Structures employing them are a very effective technique of electrical to electromagnetic energy conversion that has found broad acceptance in various types of display technology. There have, however, been limitations in the making of contact to light emitting diodes, in that wire bonding to each diode has been necessary and optical interference has been encountered in close arrays. These limitations have affected cost of manufacturing and reliability and also packing density.

DESCRIPTION OF THE INVENTION

Improved array configurations of light emitting diodes may be fabricated on a single substrate to accommodate solder reflow type connections and optical isolation by providing the substrate with two layers, the first of which contains a gradient of ingredients from a surface to the second layer so that the formation of p-n junctions at a particular point in the gradient will produce light of a specific selectable color, and the second layer when subsequently partially removed can serve as optical isolation. Metallurgical pads attached to a light emitting p-n junction will permit solder reflow type connections.

DETAILED DESCRIPTION OF THE INVENTION

Figure 1:
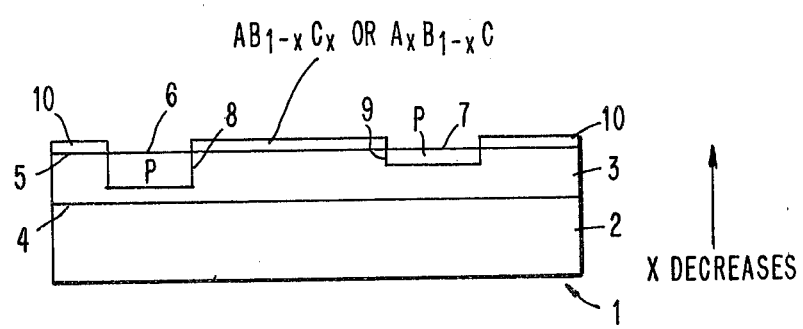
FIG. 1 is an illustration of the semiconductor body structure in which the light emitting diode regions are formed.

Referring to FIG. 1 a semiconductor body 1 in which the light emitting diode array of the invention is fabricated is shown. The body is made up of a substrate portion 2 of type AB and a graded portion 3 of, for example, an atomically compatible $A_x B_{1-x} C$ or $AB_{1-x} C_x$ formed at a demarcation 4. The function of the portion 2 is to serve as a support and as an epitaxial growth base and at the same time that have optical properties to isolate individual devices. Device arrays have clearer optical definitions when the individual diodes have a member that directs the light. The material, gallium arsenide will satisfy the criteria of element 2. With respect to element 3 a semiconductor is used that produces a different light output at a diode where the ingredient concentration at the diode varies and has the ability to alter that ingredient concentration. The material $Al_x Ga_{1-x}$ As will satisfy this criteria. The gradient is such that the higher concentration of the variable x is at the line of demarcation 4 and the lower concentration is at the upper surface 5. In the material $Al_x Ga_{1-x}$As the initial aluminum concentration is lowest at the surface 5 and progresses to a higher value as one approaches the line of demarcation 4. The body 1 is shown for illustration purposes as n-type and has p-type regions 6 and 7, each to different depths, forming p-n junctions 8 and 9, respectively, with the n-region 3. An oxide layer 10 is provided for isolation surface protection and masking purposes.

Figure 2:
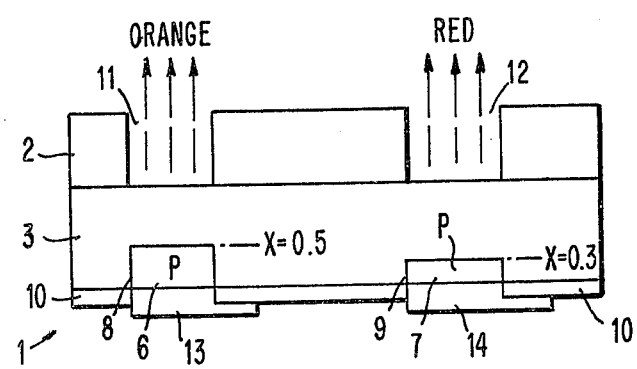
FIG. 2 is an illustration of the light emitting diode array-type structure illustrating the solder reflow connection and optical isolation properties.

Referring next to FIG. 2, the structure of FIG. 1 is fabricated into an integrated light emitting diode array in accordance with the invention set forth. In FIG. 2 the body 1 has now been turned over and openings 11 and 12 have been etched out of element 2 in order to permit light generated at light emitting diode junctions 8 and 9 to escape and to be optically isolated from adjacent diodes. The p-n junctions 8 and 9 are made to different depths to produce different colored light according to the value of the variable. In the case of the junction 9, where the material of layer 3 is $Al_x Ga_{1-x}$As, it is made to a depth corresponding to an aluminum concentration of 0.3 and red light will be emitted at the opening 12. Similarly, again where the material of layer 3 is $Al_x Ga_{1-x}$As the p-n junction 8, is made to a depth corresponding to an aluminum concentration of 0.5 and orange light will be emitted at the opening 11. Metal contacts 13 and 14 are made to p-n junctions 8 and 9, respectively, and come out to a pad region larger than the p-n junction area by being permitted to overlap the oxide 10. This permits contacts to the junctions to be made by the well known solder reflow technique where a quantity of solder sufficient to physically raise the chip array is retained on the pad by surface tension during reflow. All connections to all diodes can be made in one heat cycle by this technique.

The body 1 may be fabricated by the liquid phase epitaxy techique or by the vapor phase epitaxy. In the case of liquid phase epitaxy the graded region 3 is formed from a melt of an $A_x B_{1-x}$ C semiconductor material, for example, aluminum gallium arsenide. That is, the melt brought into contact with the substrate 2 of, for example, gallium arsenide and epitaxial material is caused to segregate from the melt maintaining the periodicity of the original crystal 2. The concentration in the melt of the aluminum and the gallium are adjusted such that they vary from the higher concentration of aluminum at the line of demarcation 4 to the lower concentration at the upper surface 5.

In the case of the vapor phase epitaxy manufacturing technique the substrate 2 of, for example, gallium phosphide, is exposed to a vapor containing the $AB_{1-x}C_x$ semiconductor, in this example, Ga $As_{1-x}P_x$ that will form the graded region 3 and then the chemical reaction in the vapor results in atomic growth maintaining the periodicity of the substrate 2 in the graded region 3. Control of the concentration of the individual elements in the graded region 3 is controlled by a combination of the temperature of the substrate and the concentration in the vapor. These techniques are well known in the art. The regions 6 and 7 are formed by coonventional p-n junction forming techniques such as alloying, diffusion or ion implantation so long as they give the depth control desired. Since it is desirable to position the p-n junctions 8 and 9 at a particular concentration in the graded region 3 it will be apparent to one skilled in the art that the control supplied by alloying, diffusion and ion implantation is adequate to achieve this end.

Figure 3:
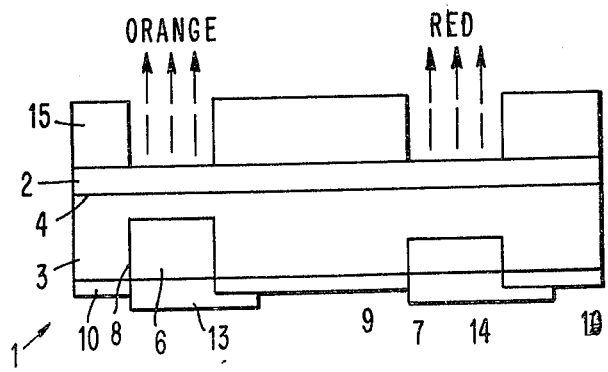
FIG. 3 is an illustration of a second semiconductor body structure in accordance with the invention into which a light emitting diode array can be formed.

Referring next to FIG. 3 an illustration is provided of a structure having the same elements as described but where the substrate 2 is lapped to an optical transparency acceptable thickness and the optical isolation is provided by a material 15, such as GaAs, that does not have to be epitaxial. This structure is particularly adaptable to vapor phase epitaxy where, when the materials gallium arsenide and phosphide are used, the volatile arsenic and phosphorous concentrations are more readily controlled in the vapor. Such a structure lends itself to growth parameter control but adds a lapping step for the thickness of the substrate 2 and the addition of the material 15.

What has been set forth is a technique of multicolor light emitting diode array fabrication that permits solder reflow connecting and optical isolation.

What is claimed is:

1. The process of forming an integrated light emitting diode array comprising in combination the steps of; providing a substrate of optically isolating semiconductor material; growing an epitaxial region of a compound semiconductor material selected from the group consisting of $AB_{1-x}C_x$ and $A_xB_{1-x}C$, said material having a vertical variation in the x value of the concentration of ingredients and decreasing in the direction of the surface of said region; forming a plurality of p-n junctions to selected depths in said epitaxial region.

removing portions of said substrate in registration with said p-n junctions; and providing electrical contact across each said p-n junction.

2. The process of claim 1 including the further step of applying an optically isolating layer with openings formed over said substrate region in registration with each said p-n junction.

3. The process of claim 1 wherein said substrate is GaAs and said graded region is $Al_xGa_{1-x}As$.

4. The process of claim 1 wherein said substrate is GaP and said graded region is $GaAs_{1-x}P_x$.

* * * * *